(12) United States Patent
Singh et al.

(10) Patent No.: US 12,278,633 B2
(45) Date of Patent: Apr. 15, 2025

(54) PULSED POWER GENERATOR FOR WIRELESS SENSOR SYSTEMS IN HARSH AND INACCESSIBLE ENVIRONMENTS

(71) Applicant: X-Wave Innovations, Inc., Gaithersburg, MD (US)

(72) Inventors: Uday Singh, Gaithersburg, MD (US); Dan Xiang, Gaithersburg, MD (US)

(73) Assignee: X-Wave Innovations, Inc., Gaithersburg, MD (US)

( * ) Notice: Subject to any disclaimer, the term of this patent is extended or adjusted under 35 U.S.C. 154(b) by 715 days.

(21) Appl. No.: 17/473,961

(22) Filed: Sep. 13, 2021

(65) Prior Publication Data

US 2023/0083820 A1     Mar. 16, 2023

(51) Int. Cl.
*H03K 3/02*     (2006.01)
*H01F 7/02*     (2006.01)
*H01F 7/20*     (2006.01)

(52) U.S. Cl.
CPC .............. *H03K 3/02* (2013.01); *H01F 7/02* (2013.01); *H01F 7/20* (2013.01)

(58) Field of Classification Search
CPC .... H03K 3/02; H03K 3/59; H01F 7/02; H01F 7/20
See application file for complete search history.

(56) References Cited

U.S. PATENT DOCUMENTS

| 11,317,193 B2 * | 4/2022 | Kosel ................... H04R 1/2892 |
| 2010/0187835 A1 * | 7/2010 | Hohlfeld ............... B81B 3/0021 |
| | | 290/1 R |

* cited by examiner

*Primary Examiner* — Emily P Pham
(74) *Attorney, Agent, or Firm* — Sheets Law PLLC; Kendal M. Sheets (57) ABSTRACT

The embodiments disclose a pulsed power generator system that can include a cantilever comprising a cantilever tip disposed on a lower surface of a first end and a permanent magnet mounted on an upper surface of the first end, wherein the cantilever is connected to an electric circuit at a second end, an electromagnet generating a time varying periodic magnetic flux, wherein the magnetic flux interacts with the permanent magnet to generate a direction-changing mechanical force that drives oscillation in the cantilever, a conducting pad, disposed adjacent to the bottom surface of the first end of the cantilever and configured so that the cantilever tip can contact the conducting pad. An oscillation of the cantilever causes the cantilever tip to periodically contact the conducting pad forming an electrical switch suitable for pulse generation through the electric circuit.

13 Claims, 9 Drawing Sheets

PULSED POWER GENERATOR FOR WIRELESS SENSOR SYSTEMS IN HARSH AND INACCESSIBLE ENVIRONMENTS

STATEMENT REGARDING FEDERALLY SPONSORED RESEARCH OR DEVELOPMENT

This invention was made with government support under #DE-SC0013745 awarded by the U.S. Department of Energy. The government has certain rights in the invention.

FIELD OF INVENTION

The present embodiments are in the technical field of pulsed power generating systems for sensor systems located in inaccessible environment. More particularly, the embodiments relate to generation of high frequency electrical pulses to activate a sensor system using a low frequency magnetic field and a mechanical cantilever.

BACKGROUND

Many energy harvesting technologies are available to supply power necessary to wireless sensors and sensor systems operating in harsh environments. For example, the thermoelectric energy harvesting system, utilizing the available temperature difference in desired sensing region, is designed as power sources. However, many of these power generating technologies and systems are suitable for providing stable power to the sensor for extended period of time due to the fact that energy harvesting essentially relies on uncontrollable environmental attribute change, such as, available temperature difference for thermal energy harvesting. Along with limited operation life all these power harvesting technologies do not directly generate electric pulses and requires electric circuits with semiconductor based components to convert electric power into electric pulses. The use of semiconductor technology with a limited operation life fails to guarantee long term reliability. Even under a friendly environment for device operation, the pulse generation and pulse shaping generally require complex circuits containing multiple active and passive electrical components. The most active components are semiconductor based and show reliable operations only up to 200'C. Higher temperature operations are possible using high temperature semiconductors, but they are still in the development stage and are not widely available. Using the silicon-based semiconductor devices will have a limited operational temperature and operational life.

Moreover, the traditional method of pulse generation using electric circuits consisting of active and passive components needs a constant power source, which is difficult to obtain and are unreliable for long term operation in harsh environment, to power those electronics components.

SUMMARY

In contrast, the problems and shortcomings of traditional devices are overcome by the embodiments for a pulse power generator system where electric pulse generation and shaping systems can be used for sensing applications in an inaccessible or harsh environment and operation through a thick metallic enclosure. In one aspect, a pulsed power generator system can include a cantilever comprising, but not limited to, a cantilever tip disposed on a lower surface of a first end and a permanent magnet mounted on an upper surface of the first end. The cantilever can be connected to an electric circuit at a second end. The system can include an electromagnet generating a time varying periodic magnetic flux, where the magnetic flux interacts with the permanent magnet to generate a direction-changing mechanical force that drives oscillation in the cantilever. The system can also include a conducting pad, disposed adjacent to the bottom surface of the first end of the cantilever and configured so that the cantilever tip can contact the conducting pad. An oscillation of the cantilever can cause the cantilever tip to periodically contact the conducting pad forming an electrical switch suitable for pulse generation through the electric circuit.

In additional aspects, the cantilever and conducting pad can be configured to be disposed within an enclosure, and the electromagnet can be configured to be disposed outside of the enclosure. In other aspects, the electromagnet can be powered by an AC voltage from a power source and can generate a time varying periodic magnetic flux. A magnetic field direction from the electromagnet changes periodically with a frequency equal to the AC voltage frequency, and the magnetic flux generated by the electromagnet induces a force on the permanent magnet causing the cantilever to oscillate. In still other aspects, the system can include a capacitor charged by a DC voltage source, where the capacitor can discharge when the cantilever end contacts the conducting pad and can generate an electric pulse through the electric circuit.

In an additional aspect, the system for a pulse power generator can include a first electrical discharge port connected to the cantilever and configured to discharge an electric pulse. In a further aspect, a second electrical discharge port can connect to the conducting pad and can be configured to discharge an electric pulse. In yet another aspect, an insulator base can be connected to the second end of the cantilever. The system additionally can include a magnetic flex coupler disposed between the permanent magnet and the electromagnet. The magnetic flex coupler can interact with a magnetic field from the electromagnet to change a magnetic field density around the cantilever. In one aspect, the cantilever, conducting pad, and magnetic flux coupler can be configured to be disposed within an enclosure, and the electromagnet can be configured to be disposed outside of the enclosure.

In another aspect, a pulsed power generator system can include a cantilever comprising a cantilever tip disposed on a lower surface of a first end and a permanent magnet mounted on an upper surface of the first end. The cantilever can be connected to an electric circuit at a second end. The system can further include an electromagnet generating a time varying periodic magnetic flux that can interact with the permanent magnet to generate a direction-changing mechanical force that can drive oscillation in the cantilever. The system can also include a piezoelectric transducer, coated on a top surface and a bottom surface with conductive thin film, a support structure connected to the top surface conductive thin film, and a conducting base connected to the bottom surface conductive thin film. The piezoelectric transducer can be disposed adjacent to the bottom surface of the first end of the cantilever and configured so that the cantilever tip can mechanically contact the support structure. In a further aspect, the cantilever tip and the support structure can be configured such that when the cantilever tip contacts the support structure, an acoustic wave pulse propagates through the support structure to the piezoelectric transducer, which can convert the acoustic wave pulse into an electric pulse that is transferred to a discharge port. In an aspect, a pulse shaping circuit, connected to the piezoelectric transducer, can control electrical properties of the electric pulse that is transferred to a discharge port. In yet another aspect, the cantilever and piezoelectric transducer can be configured to be disposed within an enclosure, and the electromagnet can be configured to be disposed outside of the enclosure.

BRIEF DESCRIPTION OF THE DRAWINGS

The present embodiments are better understood by reference to the following detailed description when considered in connection with the accompanying drawing, wherein.

DETAILED DESCRIPTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims. The present disclosure is to be considered as an exemplification of the invention and is not intended to limit the invention to the specific embodiments illustrated by the figures or description herein.

Various embodiments of the present invention may incorporate one or more of these and the other features described herein. The following detailed description taken in conjunction with the accompanying drawings may provide a better understanding of the nature and advantages of the present invention. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications. While the invention has been described with a certain degree of particularity, it is manifest that many changes may be made in detail of construction and the arrangement of components without departing from the spirit and scope of this disclosure. The present disclosure is to be considered as an exemplification of the principles of the invention and is not intended to limit the invention to the specific embodiments illustrated herein by the figures or description above.

Conventionally, electric pulses generated by pulsed power generators are used to activate sensors for sensing. The pulsed power generator typically requires a complicated electronic system containing energy sources, resonance circuits and transformers. Such conventional pulse generation approaches are not suitable for sensing applications if devices, including but not limited to wireless sensors, are required to be present and operated in an inaccessible and/or harsh environment enclosed with a metallic enclosure and no wire connection is allowed. The only possible manner to activate a wireless sensor system in such a scenario is through a remote energy transfer and pulse generation through the metal enclosure. The present embodiments are intended, but not limited to, configurations with wireless sensor systems in applications where high frequency communication is difficult to establish. The exemplary electric pulse generator system disclosed herein can be a magnetically driven system without the use of a complicated electronic circuit thereby enabling the activation of sensors and sensor systems used in environments where electrical wire connections or high frequency communication to a sensor system is not possible or not allowed.

In the embodiments, a pulse generator system for generating controlled electrical pulse signals is suitable for, but not limited to, harsh and inaccessible environments, is disclosed. In some embodiments, a cantilever pulse generator provides voltage pulses to activate sensors placed in a harsh and inaccessible environment, such as an enclosed environment. One embodiment can be combined with any pulse-driven sensor or sensor system. The combined sensor system can be located, but not limited to, inside an inaccessible area where sensing is desired. The cantilever pulse generator along with the sensor system located in the inaccessible sensing area, for example inside an enclosed canister with a thick stainless steel wall, is magnetically driven by magnetic field generated by a control system remotely from the outside of the inaccessible area.

Electric pulse generators and pulse shaping technologies are disclosed that can activate devices, in particular, sensors or sensor systems to enable sensing capabilities in an inaccessible area with more maneuverability of pulse generation. The embodiments to an exemplary electric pulse generator can be powered wirelessly by a low frequency magnetic field. The embodiments are suitable to activate sensors for sensing applications in an inaccessible enclosed region, such as, but not limited to, inside a thick metal wall enclosure. One embodiment of the exemplary pulse generator system is for applications, such as, to initiate wireless sensor interrogation in nuclear reactors or waste storage casks where through-wall wire connection is not allowed and electromagnetic wireless control is not possible because of RF signal fails to propagate through the thick metal wall. This pulse generation system allows devices to be activated from outside the enclosure encompassing such a harsh inaccessible environment.

The exemplary pulse generation system of the embodiments can comprise a metal or insulator cantilever, a permanent magnet and induction coils, which can allow generation of high frequency electrical pulse generation through thick metal enclosure or a wall. Magnetic field interaction between a permanent magnet attached to the cantilever herein and the magnetic field generated by an electromagnet drives the cantilever mechanical movement. The magnetic field from the electromagnet is tuned to the induced-force that drives the cantilever oscillation at its mechanical resonance. The cantilever at its resonance, allows the cantilever tip to make electrical and mechanical contact with metal electrode which is electrical grounded. The cantilever system is designed and tuned in such a way to generate pulses with a bandwidth frequency suitable for device activation or interrogating sensors located in hostile and inaccessible environments.

The embodiments for an electric pulse generation system for activating devices and sensors including, but not limited to wireless sensors, required to monitor environments that are difficult to access by wire connection(s) and/or electromagnetic connection(s). One embodiment of the pulse generation system can include a cantilever located inside the enclosed environment. A small permanent magnet is mounted on the cantilever and the cantilever is connected to electric circuits for pulse shaping. The cantilever motion is controlled by magnetic interaction between the permanent magnet and a magnetic field from an electromagnet situated outside the enclosed environment, through the enclosure wall sensing area. The electromagnet is driven by a sinusoidal electrical signal source which is located outside the enclosure. The magnetic interaction distance can be effectively extended by adding magnetic materials between the cantilever and the electromagnet to modify the magnetic flux between the permanent magnet and the electromagnet.

According to the embodiment, a pulse power generator system can include a metal cantilever, permanent magnet, electric charging and discharging electronics, electromagnet, and conducting pad such as a metal electrode. In one embodiment, the electromagnet can be powered by an AC voltage from the power source and generates time varying periodic magnetic flux, where the magnetic field direction is changing periodically with frequency equal to the AC voltage frequency used to power the electromagnet. The magnetic flux generated by the electromagnetic induces force on the permanent magnetic attached to the cantilever, thus, making cantilever to oscillate. The frequency of the AC voltage to the electromagnet is tuned to induce oscillation in the cantilever at its mechanical resonance. The direction-varying flux interacts with the permanent magnet either directly without any coupling object or through an additional magnetic flux coupler. In both cases, the permanent magnetic field interacts with the AC-generated magnetic flux and generates a direction-changing mechanical force. The mechanical force drives the cantilever oscillation. The cantilever at its mechanical resonance frequency has high oscillation amplitude and makes periodic contacts with the metal electrode, forming a electrical switch suitable for pulse generation.

In another embodiment, the metal cantilever can be connected to a DC voltage source through electric charge and discharge electrical network. The DC voltage sources charge a capacitor which is instantly discharged when the cantilever contacts the metal ground electrode. The instantaneous discharge generates electric pulses for device operation. The discharging rate is controlled to limit the current flow from cantilever to prevent the tip device damage caused by excessive current passing though the tip.

Figure 1:
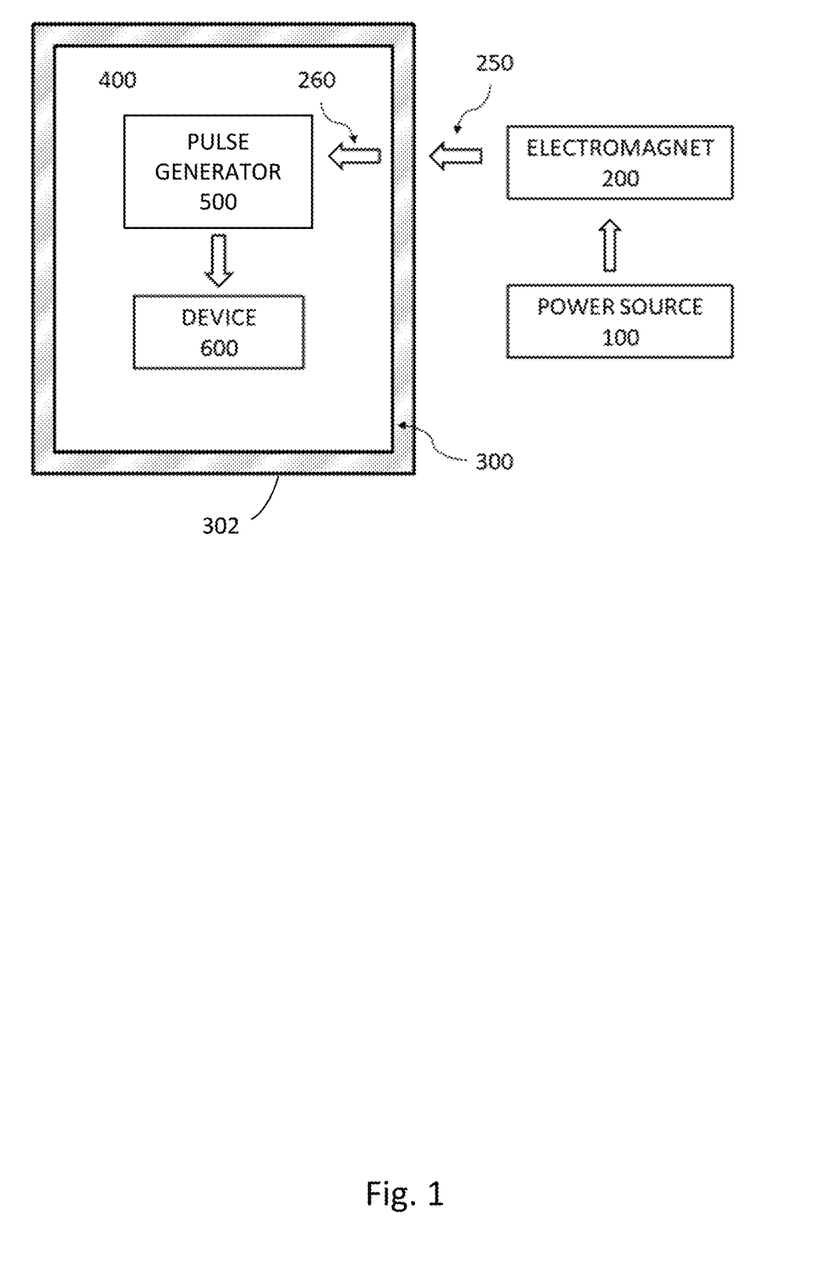
FIG. 1 illustrates a block diagram of a pulsed power generator of the embodiments.

FIG. 1 illustrates a block diagram of a pulsed power generator of the embodiments. A power source 100 can provide a voltage, either AC or DC, to an electromagnet 200, which can generate magnetic field 250. If using AC voltage, the frequency of the AC voltage is can vary according to the embodiments. Magnetic field 250 generated by the electromagnet 200 can be time-varying as the frequency equal to the AC voltage frequency from the power source 100. An enclosure 302 can include any partial or full type of enclosure or structure. The magnetic field 250 can propagate through an enclosure wall 300 and enter the enclosed space 400 as a magnetic field 260. The material and thickness of the enclosing wall 300 can vary depending on the structural build and environmental conditions. The amplitude of magnetic field 260 is smaller than the magnetic field 250. The reduction in magnetic field is contributed by first, the larger distance between 260 and the electromagnet 200. Second, the magnetic properties of the wall 300 directly affects the magnetic field 260 strength and third, the frequency of magnetic field 250. At higher frequency the skin depth decreases, thus the penetration depth of magnetic field 250 is reduced. The distance between the electromagnet 200 and wall 300 can vary according to the embodiments. The frequency of AC voltage can also vary according to the embodiments. The enclosed space 400 is preferably, but not limited to, a vacuum or a space filled with inert gases. The pulse generator 500 can powered and driven by the magnetic field 260 to generate electric pulses. The generated pulse by 500 may be used to activate device 600, including but not limited to, initiating sensor interrogation.

Figure 2:
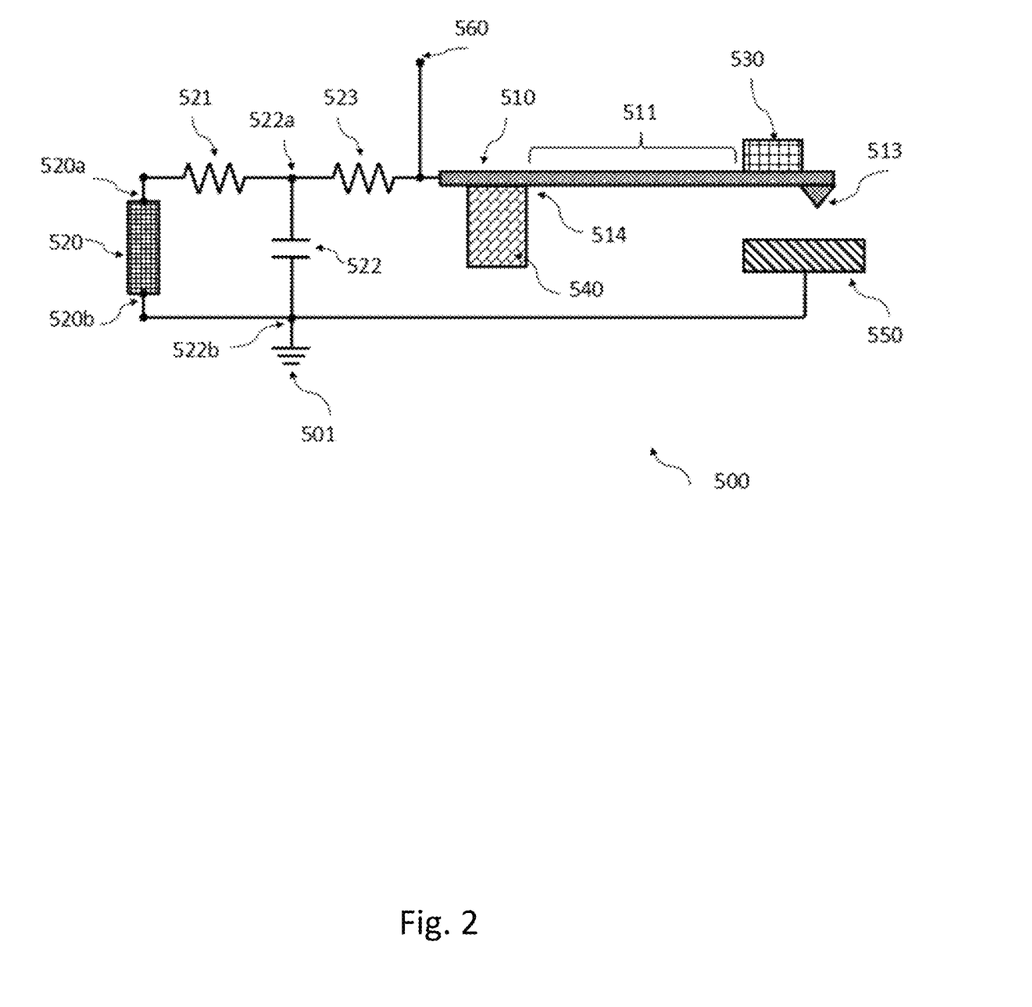
FIG. 2 is a schematic representation of an electric pulse generator according to the embodiments.

FIG. 2 is a schematic representation of an exemplary electric pulse generator 500 according to the embodiments shown in FIG. 1. Components of the electric pulse generator 500 can include a cantilever 510. In a non-limiting embodiment, the cantilever 510 can be constructed of metal, however other embodiments could construct the cantilever 510 of other materials that could function with the embodiments described herein for a power pulse generator. A first end of the cantilever 510 can be mechanically fastened to an insulator base 540. A rigid contact 514 is fastened to and between the cantilever 510 and the insulator base 540 that can create mechanical strength at the rigid contact 514. Without a strong rigid contact 514 point, performance of the cantilever 510 can become compromised. A permanent magnet 530 can be mechanically attached to a second, or free, end of the cantilever 510. A cantilever tip 513 can be disposed at the second, or free, end of the cantilever and facing a conducting pad 550. A distance 511 between the insulator base 540 and the magnet 530 can vary according to the embodiments. A thickness and width of the cantilever 510 can also vary according to the embodiments. A mechanical resonance frequency of the cantilever 510 can depend upon the thickness, distance 511, and the material properties of the cantilever 510. A conducting pad 550 can be kept electrically grounded by connecting it to an electrical ground

501. At resonance, the cantilever tip 513 makes electrical and mechanical contact with the metal conducting pad 550, thus forming an electrical switch. In one embodiment, a DC power source 520 is used to power the cantilever switch for generating electric pulses. The ground port 520*b* of the DC power is connected to the electrical ground 501 and the live port 520*a* is connected to charging resistor 521. The charging capacitor node 522*a* is connected to the charging resistor 521 and node 522*b* is connected to the electrical ground 501. The charging capacitor 522 is charged by the DC source 520 via charging resistor 521. The charging time of the capacitor 522 is smaller than the time period of the cantilever at resonance. The charging time of the capacitor 522 can vary according to the embodiments. The port 522*a* of the charge capacitor 522 is also connected to discharging resistor 523. The other port of the discharge resistor 523 is connected to the cantilever 510 end which is mechanically connected to insulator base 540.

In operation, when the cantilever tip 513 makes electrical contact with conducting pad 550, the capacitor 522 can discharge through a discharging resistor 523. The discharging can generate an electrical pulse at port 560. The discharging time governs the center frequency of the generated pulse. The discharging time can be controlled by the discharging resistor 523. A shorter discharging time generates higher frequency electrical pulses. The operational frequency of a power source 100, such as a voltage oscillator, can be tuned such that it matches the mechanical oscillating frequency of the cantilever 510.

Figure 3:
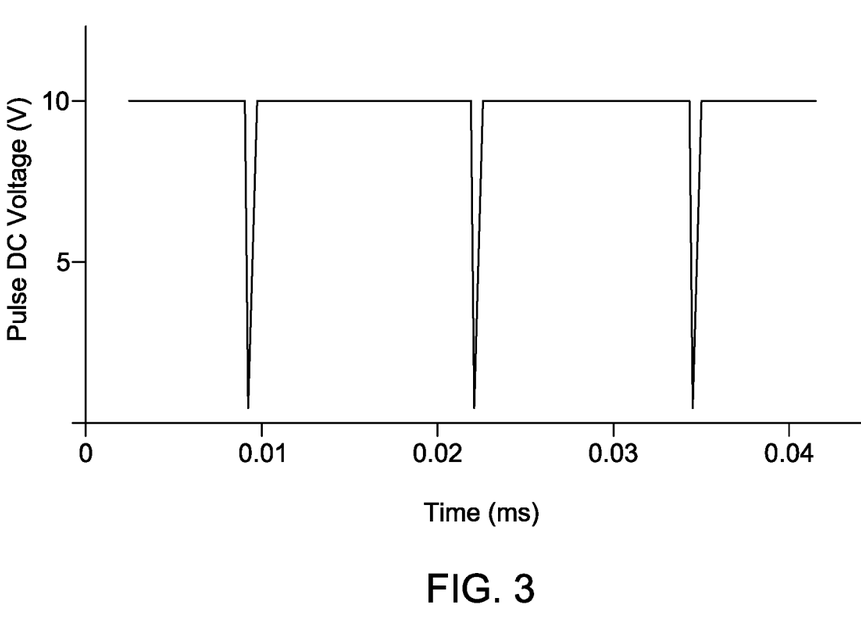
FIG. 3 is a graphical representation of idealized impulse from the electric pulse generator of FIG. 2.

Referring now to FIG. 3, a graphical representation of an idealized impulse from the electric pulse generator of FIG. 2 is illustrated. The electrical pulses are DC biased pulses with DC level equal to the DC voltage from the DC source 520 shown in FIG. 2. For sensing action, the electric pulse is transferred using port 560 to device 600 shown in FIG. 1.

Figure 4:
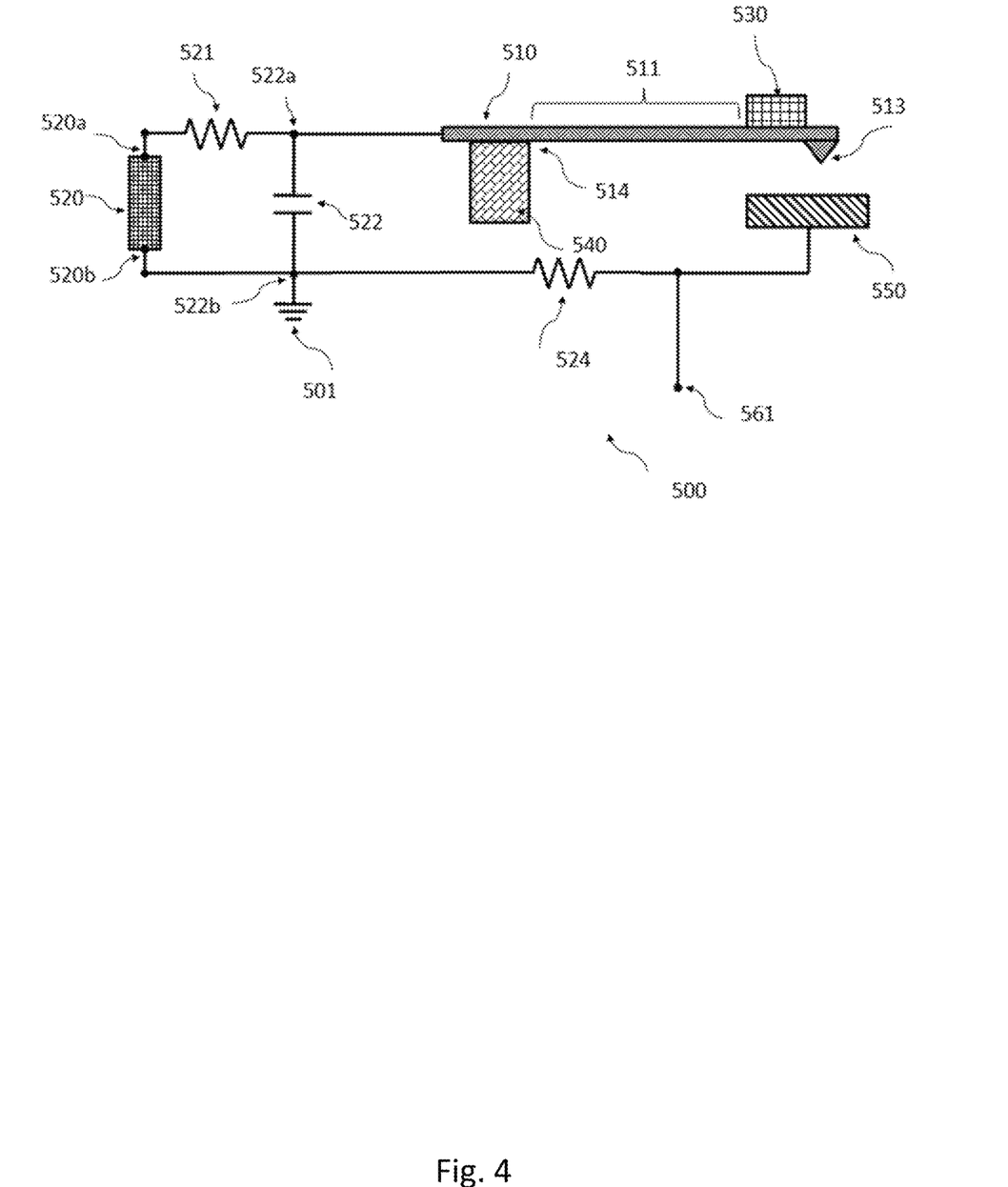
FIG. 4 is a schematic representation of an electric pulse generator according to an alternative embodiment.

FIG. 4 is a schematic representation of an electric pulse generator according to an alternative embodiment. FIG. 4 illustrates an alternate embodiment of a pulse generator 500 in accordance with an aspect of an embodiment. Here, node 522*a* of the charge capacitor 522 can be connected directly to the cantilever. The discharging resistor 524 can be connected to the conducting pad 550. The conducting pad can be connected to the ground 501 through the discharging resistor 524. When cantilever tip 513 makes electrical contact to the conducting pad 550, the capacitor 522 can discharge though discharging resistor 524, generating an electrical pulse at node 561. A shorter discharging time can generate higher frequency electrical pulses. The pulse height can depend on the discharge current passing through discharging resistor 524.

Figure 5:
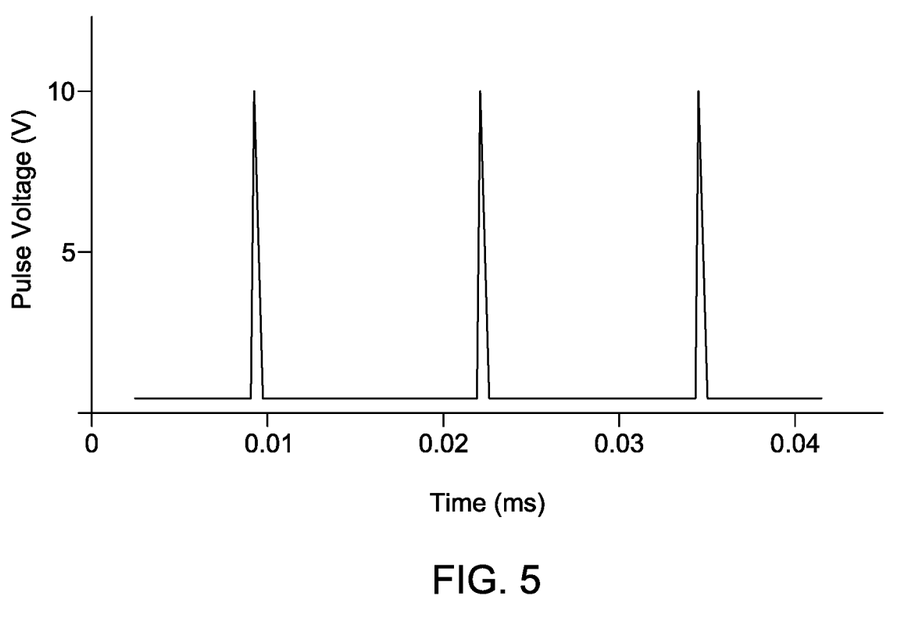
FIG. 5 is a graphical representation of idealized impulse from the generator of FIG. 4.

FIG. 5 is a graphical representation of idealized impulse from the generator of FIG. 4. FIG. 5 illustrates the shape of electric pulses generated by the embodiment shown in FIG. 4. The electrical pulses are not DC biased. For sensing action, the electric pulse is transferred to device 600 shown in FIG. 1.

In further detail, in reference to FIG. 2 and FIG. 4, the electric components and properties of the voltage source 520, the charge capacitor 522, charging capacitor 521, and discharging capacitor 523, 524, may vary and can rely on the electrical properties of the generated pulse necessary to activate device 600, such as but not limited to, for initiating sensor interrogation.

Figure 6:
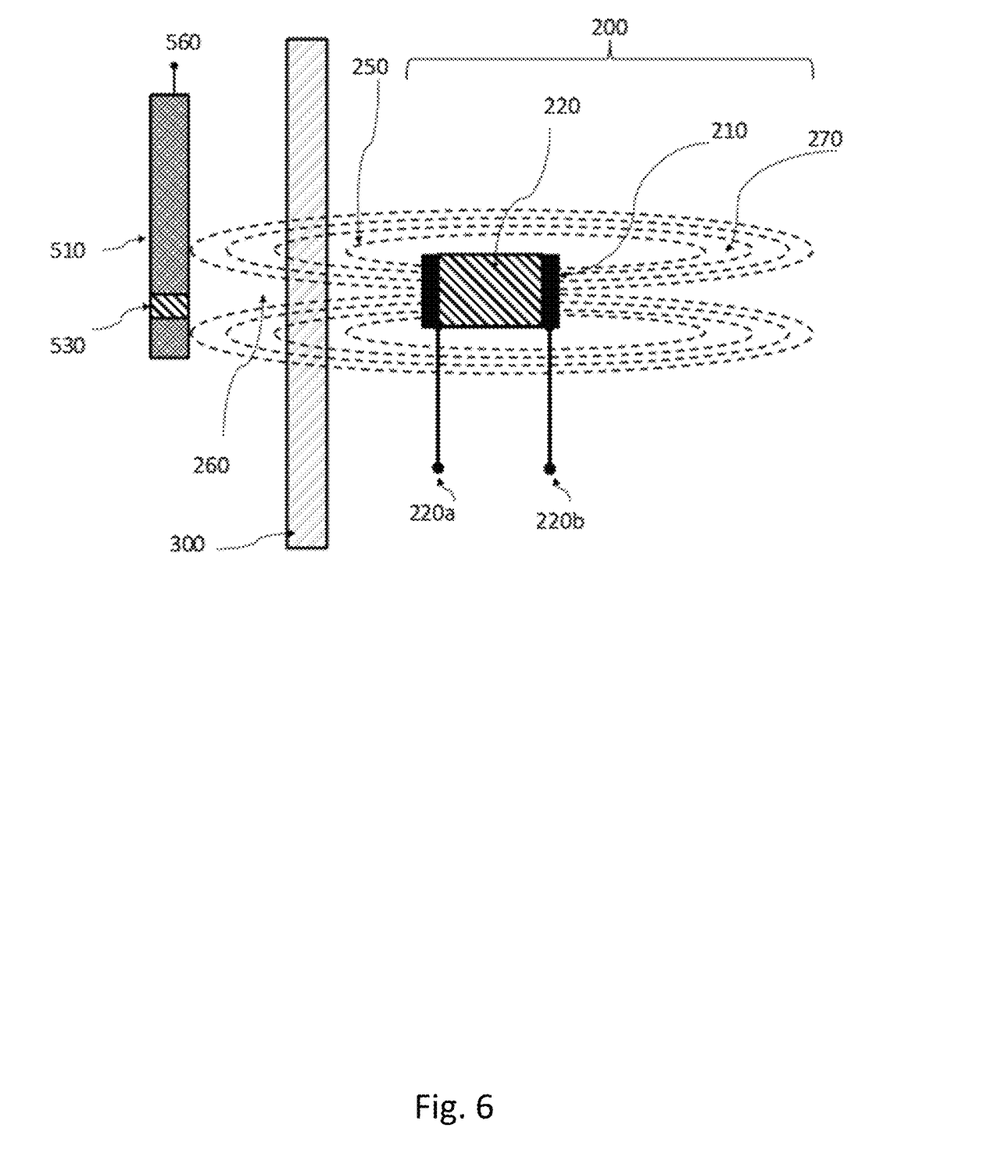
FIG. 6 is a graphical representation of magnetic field interaction in accordance to embodiment in FIG. 1.

In further detail, now reference to FIG. 6, the illustration is shown of magnetic field generated by the electromagnet 200 (shown in FIG. 1), and the interaction of magnetic field with the permanent magnet 530 attached to the cantilever 510 (shown in FIG. 2 and FIG. 4). The electromagnet 200 consists of magnetic core 210 and an electromagnet coil 220. The magnet core 210 shape and the number of turns in the electromagnet coil 220 can vary according to the embodiments. The electromagnet coil 220 ports, 220*a* and 220*b* are connecting to the power supply 100 (shown in FIG. 1). When powered, current passes in the electromagnet coil 220, generating magnetic field 250 and 270. The magnetic field 250 penetrates the enclosure wall 300 and reaches the enclosed region 400, as magnetic field 260. The magnetic field in the enclosed region interacts with the permanent magnet 530, mechanically attached to the cantilever 510, asserting force on the cantilever 510 and making the cantilever 510 to move or vibrate.

Figure 7:
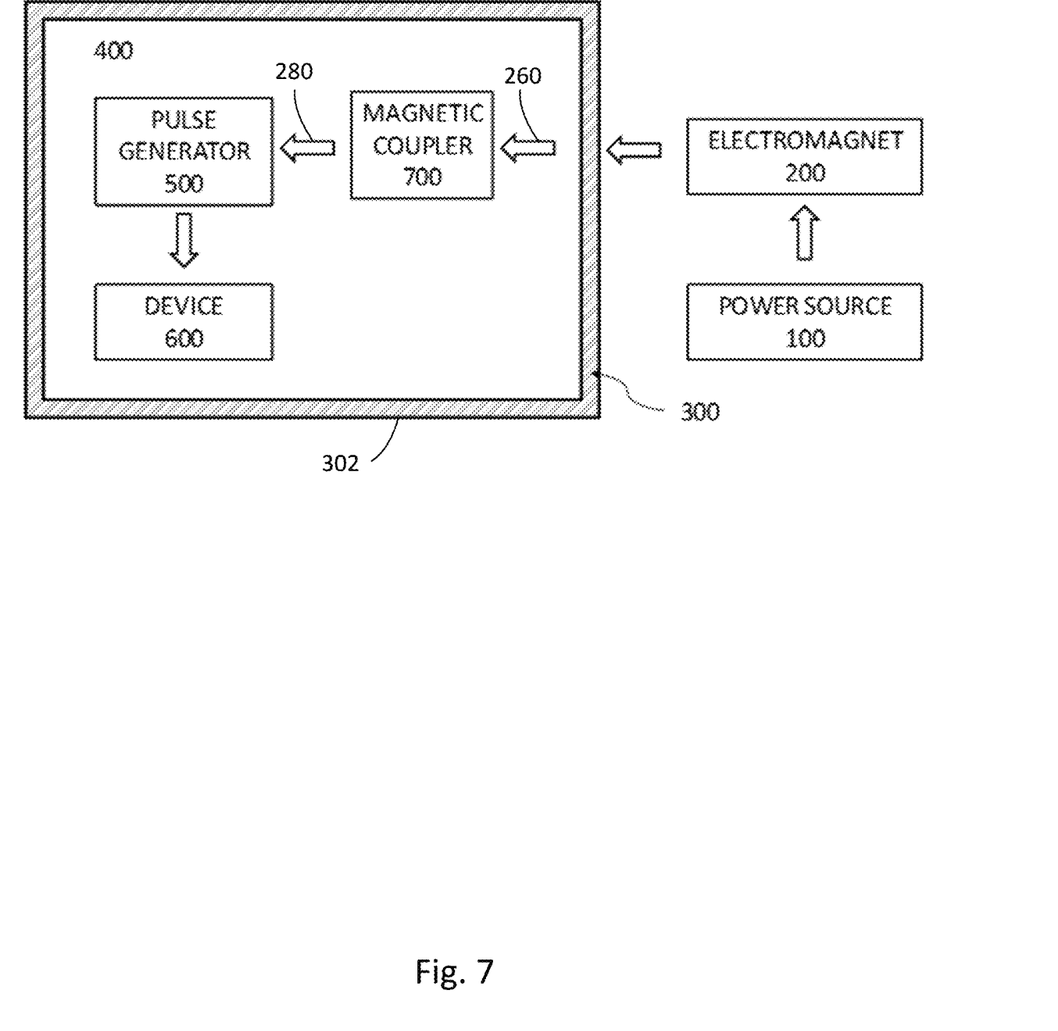
FIG. 7 illustrates a block diagram of a pulsed power generator of an alternative embodiment.

FIG. 7 illustrates a block diagram of a pulsed power generator of an alternative embodiment. In an embodiment, a magnetic flux coupler 700 can be placed in the enclosed region 400, between the permanent magnet 530 (shown in FIG. 2 and FIG. 4) of the pulse generator 500 and the electromagnet 200. The magnetic coupler 700 can be constructed of magnetic material that interacts with magnetic field 260 inside the enclosed region 400 and alters magnetic field 260 into magnetic field 280 by changing magnetic field density. The magnetic coupler 700 can assist in extending a distance between pulse generator 500 and the electromagnet 200 so that pulse generator 500 and the device 600 can be located further from electromagnet 200 than could be without magnetic coupler 700. Exact distances from device 600 and electromagnet 200 to electromagnet 200 can vary according to wall 300 density or thickness, any intervening barriers, walls, materials, etc., and magnetic, electrical, or other environmental conditions inside enclosed region 400. The shape, size and the magnetic materials of the flux coupler 700 can vary according to the embodiments.

Figure 8:
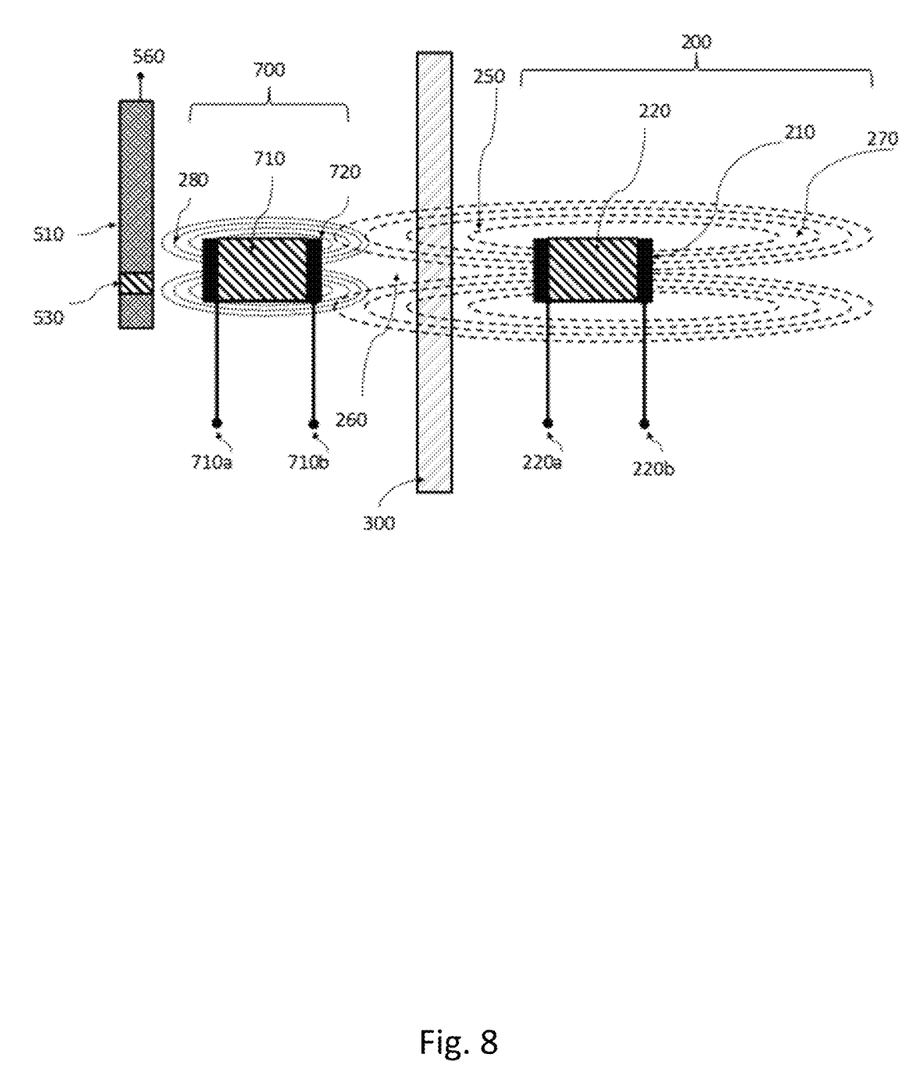
FIG. 8 is a graphical representation of magnetic field interaction of an alternative embodiment of FIG. 7.

FIG. 8 is a graphical representation of magnetic field interaction of an alternative embodiment of FIG. 7. The magnetic flux coupler 700 made of a magnet core 720 and electromagnet coil 710 is positioned in the enclosed region 400, between the permanent magnet 530 (shown in FIG. 2 and FIG. 4) of the pulse generator 500 and the electromagnet 200. The magnetic coupler 700 can interact with the magnetic field 260 in the enclosed region generated by the electromagnet 200. The interaction between the coupler 700 and the field 260 lead to the generation of magnetic field 280, which can interact with the permanent magnet 530 attached to the cantilever 510, forcing cantilever 510 to oscillate. The time varying magnetic 260 can induce voltage in a coil 710. This induced voltage can be used to generate an electric pulse by connecting port 710*a* and port 720*b* to port 520*a* and 520*b* shown in FIG. 2 and FIG. 4. This embodiment eliminates the need of DC voltage source 520 used in embodiments shown in FIG. 2 and FIG. 4. The number of turns in the coil 710 and materials used and shape of magnetic core 720 can vary according to the embodiments.

Figure 9:
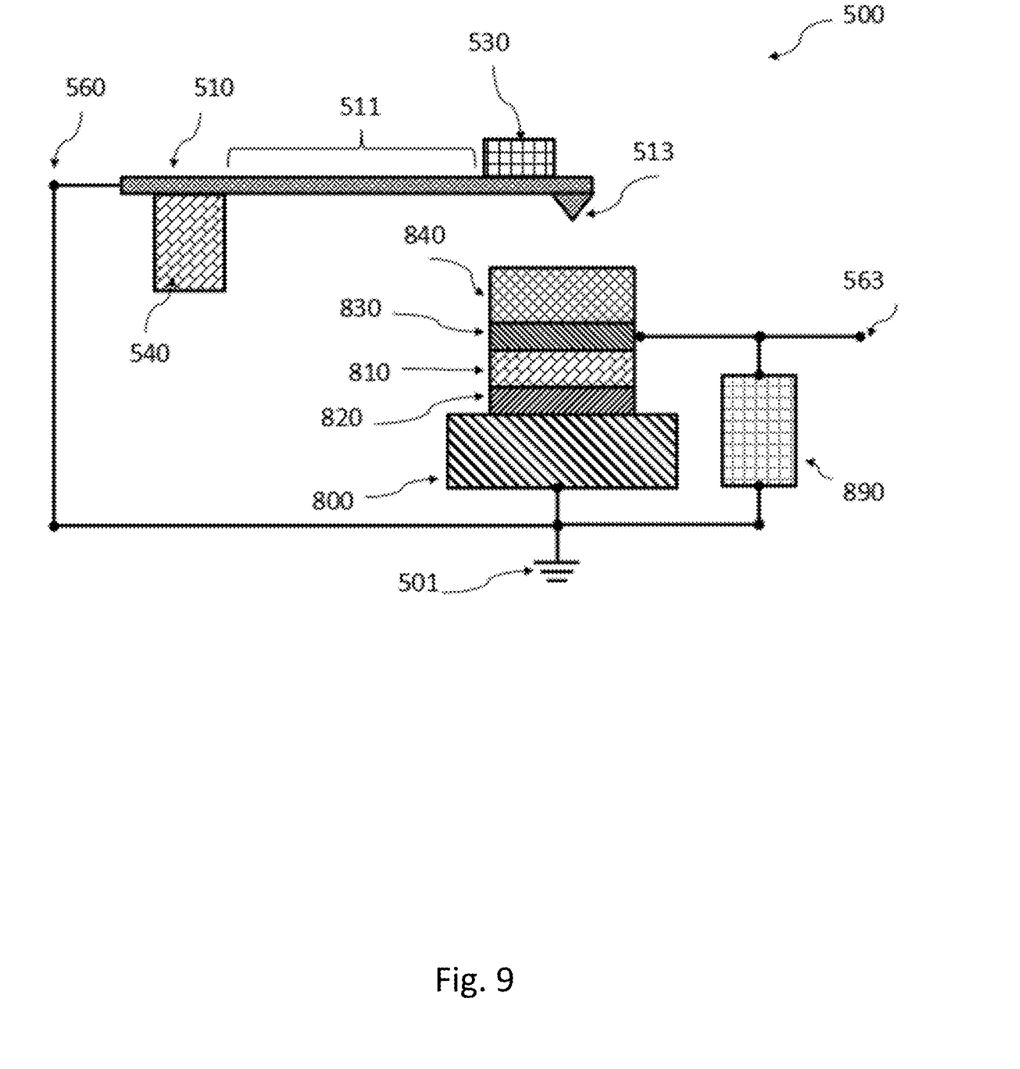
FIG. 9 is a schematic of an alternate embodiment of a pulse generator using piezoelectric substrate.

FIG. 9 is a schematic of an alternate embodiment of pulse generator 500 using piezoelectric substrate. The embodiment includes a piezoelectric transducer 810 formed with piezoelectric substrate, preferably, but not limited to, PZT, LiNbO3, etc. The top and bottom surface of piezoelectric transducer 810 can be coated with a conductive thin film 820 and 830, respectively, using physical deposition technique or other techniques known in the art. The thickness of the conducting thin films 820 and 830 can vary according to the embodiments. The piezoelectric transducer 810 bottom surface conducting thin film 820 can be mechanically bonded to the metal conducting base 800, which can provide mechanical support to the whole piezoelectric substrates during pulse generation as well as serve as a connection to the electrical ground 510. The top surface conductive thin film 830 can be bonded to support structure 840. The support structure 840 can be a conductive metal, such as, but not limited to, stainless steel, titanium, etc., or insulator, such as, but not limited to, quartz, glass, etc.

Referring again to FIG. 9, when the alternative pulse generator is in operation, the cantilever tip 513 can contact the support structure 840 causing an acoustic wave pulse to be generated and then propagated through support structure 840 toward the piezoelectric substrate 810. The piezoelectric substrate 810 can convert the mechanical pulse into an electric pulse. The output can be connected to the pulse shaping circuit 890 to control the electrical properties of the pulse generated. The pulse can be propagated to device 600 via port 563 for sensing applications. A central frequency of the generate pulse can vary and can depend upon a thickness of the piezoelectric substrate 810 and the pulse shaping circuit 890.

The embodiments can provide pulsed power generating systems to trigger devices, including but not limited to, wireless sensors operated at an enclosed or an inaccessible area and in harsh environments. The superior benefits of the pulse generation system embodiments described herein are advantageously derived from the magnetically driven cantilever 510. The contact between the cantilever tip 513 and a ground electrode can discharge generated pulse power without the aid of complicated electronic circuits. Furthermore, the simplicity of the circuits allows being installed (controlled) in (from) the outside of the enclosed and inaccessible areas with only passive electronic components. The proper material choice of a cantilever and an electrode can also ensure long-term operation in a radiation environment.

While the invention has been described with a certain degree of particularity, it is manifest that many changes may be made in detail of construction and the arrangement of components without departing from the spirit and scope of this disclosure. The present embodiment is to be considered as an exemplification of the invention and is not intended to limit the invention to the specific embodiments herein illustrated by the figures or description above.

What is claimed is:

1. A pulsed power generator system, comprising:
    a cantilever comprising a cantilever tip disposed on a lower surface of a first end and a permanent magnet mounted on an upper surface of the first end, wherein the cantilever is connected to an electric circuit at a second end;
    an electromagnet generating a time varying periodic magnetic flux, wherein the time varying periodic magnetic flux interacts with the permanent magnet to generate a direction-changing mechanical force that drives oscillation in the cantilever;
    a conducting pad, disposed adjacent to the bottom surface of the first end of the cantilever and configured so that the cantilever tip can contact the conducting pad,
    wherein an oscillation of the cantilever causes the cantilever tip to periodically contact the conducting pad forming an electrical switch suitable for pulse generation through the electric circuit.

2. The pulsed power generator system of claim 1, wherein the cantilever and conducting pad are configured to be disposed within an enclosure, and
    the electromagnet is configured to be disposed outside of the enclosure.

3. The pulsed power generator system of claim 1, wherein the electromagnet is powered by an AC voltage from a power source and generates the time varying periodic magnetic flux,
    a magnetic field direction from the electromagnet changes periodically with a frequency equal to the AC voltage frequency, and
    the time varying periodic magnetic flux generated by the electromagnet induces a force on the permanent magnet causing the cantilever to oscillate at its resonance frequency.

4. The pulsed power generator system of claim 1, further comprising a capacitor charged by a DC voltage source, wherein capacitor is discharged when the cantilever end contacts the conducting pad and generates an electric pulse through the electric circuit.

5. The pulsed power generator system of claim 1, further comprising a first electrical discharge port connected to the cantilever and configured to discharge an electric pulse.

6. The pulsed power generator system of claim 5, further comprising a second electrical discharge port connected to the conducting pad and configured to discharge an electric pulse.

7. The pulsed power generator system of claim 1, further comprising an insulator base connected to the second end of the cantilever.

8. The pulsed power generator system of claim 1, further comprising a magnetic flex coupler disposed between the permanent magnet and the electromagnet, wherein the magnetic flex coupler can interact with a magnetic field from the electromagnet to change a magnetic field density around the cantilever.

9. The pulsed power generator system of claim 8, wherein the cantilever, the conducting pad, and the magnetic flex coupler are configured to be disposed within an enclosure, and
    the electromagnet is configured to be disposed outside of the enclosure.

10. A pulsed power generator system, comprising:
    a cantilever comprising a cantilever tip disposed on a lower surface of a first end and a permanent magnet mounted on an upper surface of the first end, wherein the cantilever is connected to an electric circuit at a second end;
    an electromagnet generating a time varying periodic magnetic flux, wherein the time varying periodic magnetic flux interacts with the permanent magnet to generate a direction-changing mechanical force that drives oscillation in the cantilever;
    a piezoelectric transducer, coated on a top surface and a bottom surface with conductive thin film;
    a support structure connected to the top surface conductive thin film;
    a conducting base connected to the bottom surface conductive thin film,
    wherein the piezoelectric transducer is disposed adjacent to the bottom surface of the first end of the cantilever and configured so that the cantilever tip can mechanically contact the support structure.

11. The pulsed power generator system of claim 10, wherein the cantilever tip and the support structure are configured such that when the cantilever tip contacts the support structure an acoustic wave pulse propagates through the support structure to the piezoelectric transducer hich converts the acoustic wave pulse into an electric pulse that is transferred to a discharge port.

12. The pulsed power generator system of claim 11, further comprising a pulse shaping circuit, connected to the piezoelectric transducer, wherein the pulse shaping circuit controls electrical properties of the electric pulse that is transferred to the discharge port.

13. The pulsed power generator system of claim 10, wherein the cantilever and the piezoelectric transducer are configured to be disposed within an enclosure, and the electromagnet is configured to be disposed outside of the enclosure.

* * * * *